US009933477B2

(12) United States Patent
Zobel et al.

(10) Patent No.: US 9,933,477 B2
(45) Date of Patent: Apr. 3, 2018

(54) SEMICONDUCTOR CHIP HAVING TRANSISTOR DEGRADATION REVERSAL MECHANISM

(71) Applicant: Intel Corporation, Santa Clara, CA (US)

(72) Inventors: Shmuel Zobel, Hinanit (IL); Maxim Levit, Binyamina (IL)

(73) Assignee: INTEL CORPORATION, Santa Clara, CA (US)

( * ) Notice: Subject to any disclaimer, the term of this patent is extended or adjusted under 35 U.S.C. 154(b) by 668 days.

(21) Appl. No.: 14/228,728

(22) Filed: Mar. 28, 2014

(65) Prior Publication Data

US 2015/0276851 A1 Oct. 1, 2015

(51) Int. Cl.
| | |
|---|---|
| *G01R 31/3187* | (2006.01) |
| *G01R 31/26* | (2014.01) |
| *G05F 1/56* | (2006.01) |
| *G06F 1/26* | (2006.01) |

(52) U.S. Cl.
CPC .......... *G01R 31/2642* (2013.01); *G05F 1/56* (2013.01); *G06F 1/26* (2013.01); *G01R 31/2608* (2013.01)

(58) Field of Classification Search
CPC .............. G01R 29/26; G01R 31/31709; G01R 31/2646
USPC .................................. 324/76.39, 613, 750.3
See application file for complete search history.

(56) References Cited

U.S. PATENT DOCUMENTS

| 5,208,530 A * | 5/1993 | El-Ayat | G01R 31/2884 324/762.02 |
|---|---|---|---|
| 6,310,492 B1 * | 10/2001 | Ikoma | H03K 19/0016 326/81 |
| 6,621,860 B1 * | 9/2003 | Yamaguchi | G01R 29/26 324/620 |
| 7,478,253 B2 | 1/2009 | Levit | |
| 7,838,958 B2 * | 11/2010 | Bolam | H01L 22/14 257/467 |
| 2003/0094937 A1 * | 5/2003 | Soma | G01R 31/31725 324/76.39 |
| 2004/0148580 A1 * | 7/2004 | de Obaldia | H04B 17/29 714/715 |
| 2004/0190208 A1 | 9/2004 | Levit | |
| 2009/0322409 A1 | 12/2009 | Levit et al. | |
| 2013/0054179 A1 | 2/2013 | Shapira et al. | |
| 2015/0006971 A1 | 1/2015 | Shapira et al. | |

* cited by examiner

*Primary Examiner* — Giovanni Astacio-Oquendo
(74) *Attorney, Agent, or Firm* — Nicholson De Vos Webster & Elliott LLP

(57) ABSTRACT

A method is described that includes monitoring degradation of a semiconductor chip's transistors during normal operation. The method further includes raising an internal voltage of the semiconductor chip in response to the degradation. The method further includes determining that the degradation has reached a threshold. The method further includes triggering application of an elevated temperature to the semiconductor chip so that the degradation is at least partially reversed. The method further includes applying a new lower internal voltage of the semiconductor chip in account of the degradation reversal.

20 Claims, 11 Drawing Sheets

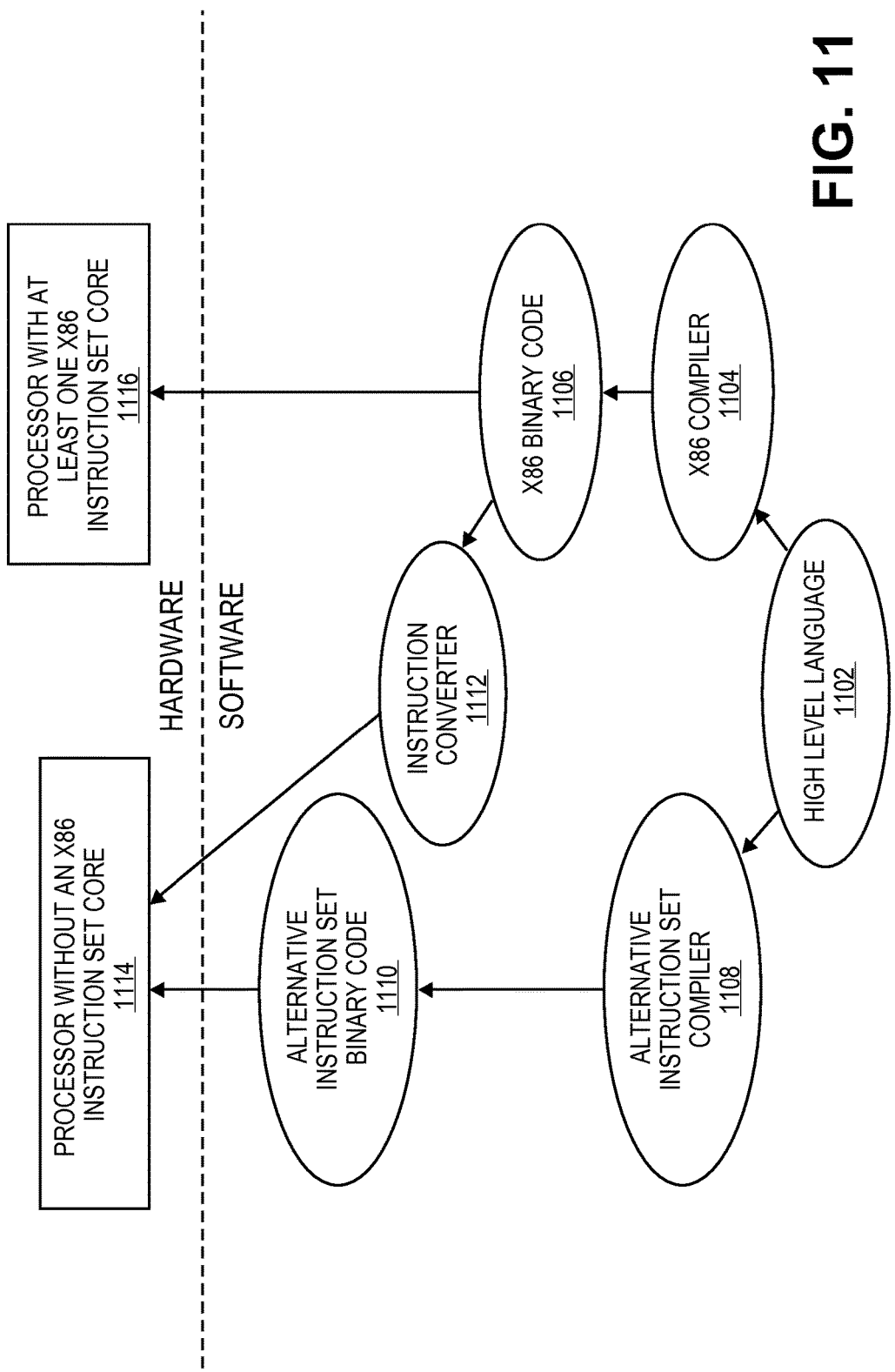

SEMICONDUCTOR CHIP HAVING TRANSISTOR DEGRADATION REVERSAL MECHANISM

FIELD OF THE INVENTION

The field of invention pertains generally to semiconductor technology and, more specifically, to a semiconductor chip having a transistor degradation reversal mechanism.

BACKGROUND

A transistor can be viewed as the atomic processing unit of a semiconductor chip. Billions of transistors are presently being implemented on a single semiconductor chip to perform extremely complex functions (such as multiple general purpose processing cores interconnected with a memory controller, I/O control hub, graphics processor, etc.). The faster the transistors are able to "switch" the faster the semiconductor chip's various logic functions will be able to operate.

Threshold voltage ($V_T$) and gain (B) are two transistor parameters that are strongly correlated to the speed at which a transistor can switch. The threshold voltage is the voltage applied at the transistor's gate electrode at which the transistor will turn "on" (more specifically, carriers are generated in the transistor's channel). The gain of a transistor is the degree to which a transistor will amplify an input signal (in the case of a traditional field effect transistor, the gain is referred to as the "transconductance" which specifies how much drain/source output current will be generated for an applied input gate/source voltage).

As a transistor continues to operate over an extended operating time its threshold voltage and/or gain (typically both) will degrade. Specifically, the threshold voltage will drift upward which in turn causes a need to apply higher gate voltages to "turn on" the transistor. Additionally, the gain will drift lower which in turn causes a need to apply higher drain to source voltages and/or higher gate voltages to generate the same output current.

Thus, as a consequence of the transistor's degradation, the transistor's speed diminishes over the course of its lifetime. As a consequence of the transistor's drop in speed over its lifetime, semiconductor chips have traditionally been "rated" for a maximum speed that corresponds to the fastest that its transistors can reliably operate at the end of the expected lifetime of the chip. That is, the maximum speed rating of the semiconductor chip is based on how slow the transistors are expected to operate towards the end of their life. Because transistors can operate at much faster speeds in the beginning of their life, there is some efficiency loss by rating maximum speed on the slower, end of life transistor speed.

FIGURES

A better understanding of the present invention can be obtained from the following detailed description in conjunction with the following drawings, in which:

FIG. 11 illustrates a block diagram contrasting the use of a software instruction converter to convert binary instructions in a source instruction set to binary instructions in a target instruction set according to embodiments of the invention;

DETAILED DESCRIPTION

Figure 1:
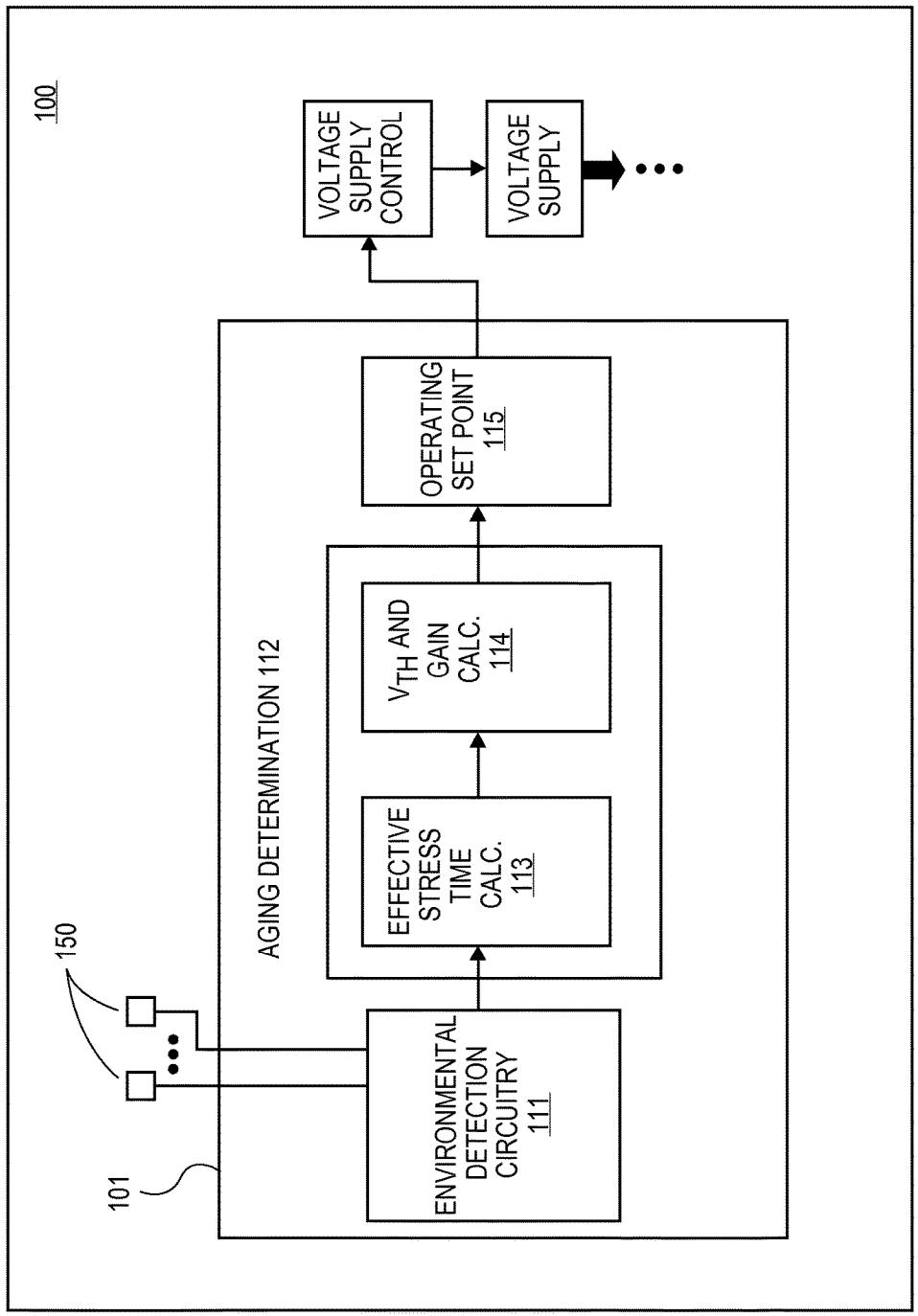
FIG. 1 shows a prior art transistor degradation monitoring technology.

FIG. 1 shows a prior art approach that attempts to compensate for transistor degradation by actively tracking transistor degradation and using the tracked degradation information to apply lower voltages at the beginning of transistor lifetime (because the transistors are faster at their beginning of life they do not need higher voltages to operate at high speeds) and then increasingly applying higher voltages toward the end of transistor lifetime (to keep the transistors operating at a specified high speed). The overall approach corresponds to a more efficient use of the semiconductor chip in terms of its speed and power consumption over the course of the chip's lifetime.

As observed in FIG. 1, a semiconductor chip 100 is designed to include transistor degradation compensation circuitry 101 that is composed of environmental detection circuitry 111, aging determination circuitry 112 and operating set point circuitry 115. The environmental detection circuitry 111 tracks certain key environmental conditions under which the transistors have operated. These include, for example, the length of time over which the transistors have operated and the voltages and temperatures that the transistors have been subjected to over this length of time.

Here, the environmental detection circuitry 111 may be composed of a plurality of "probes" 150 (e.g., any or all of thermo-resistor, thermocouple, voltage sense circuit, current sense circuit) within the semiconductor chip 100 that physically measure temperature and applied gate and/or drain/source voltage at one or more transistors within the semiconductor chip 100. The environmental detection circuitry 111 may also include or be coupled to some kind of counter or other time measurement circuit in order to measure the amount of time at which the monitored temperatures/voltages have been applied to the semiconductor chip's transistors.

The environmental conditions determined by the environmental detection circuitry 111 are provided to the aging determination circuitry 112. The aging determination circuitry 112 calculates the degradation effects or "aging" of the transistors (e.g., reduced threshold voltage, reduced gain, etc.). These degradation effects are essentially an estimation of the degradation effects based on a theoretical and/or empirical understanding of the underlying physics of the transistor devices including but not limited to experimental results performed during the regular semiconductor chip qualification process prior to mass production. As will be described in more detail below, the aging determination circuitry can be viewed as being composed of two stages 113, 114. A first stage 113 calculates the effective stress time based on the environmental conditions that the transistors are subjected to during normal operation. A second stage 114 determines new higher threshold voltages and lower gain for the transistors based on the effective stress time provided by circuit 113.

Here, both stages 113, 114 of the aging determination circuitry 112 can be viewed as circuitry that has instantiated one or more equations that are descriptive of the degradation behavior of the semiconductor chip's transistors and executes these equations responsive to the environmental input values provided to the first stage 113 by the environmental detection circuitry 111.

Figure 2:
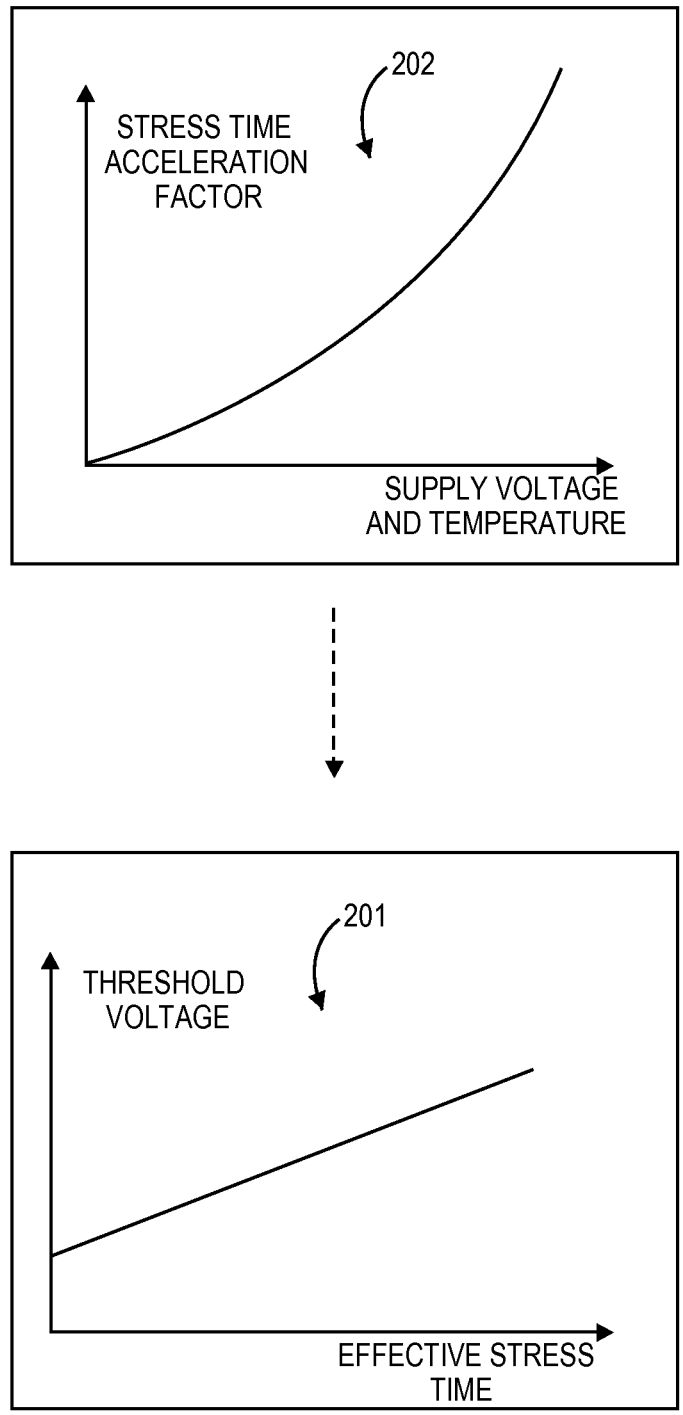
FIG. 2 shows relationships employed by the prior art transistor degradation monitoring technology of FIG. 2.

FIG. 2 provides more details concerning the first stage 113 and the second stage 114 of the aging determination circuitry 112. For simplicity FIG. 2 only pertains to threshold voltage degradation (gain is not depicted but can be treated similarly). As observed in FIG. 2, the second stage 114 determines the increase in threshold voltage by employing a reference relationship 201 that establishes threshold voltage as a function of effective "stress time". From the shape of the relationship 201, the threshold voltage will continually creep upward as the effective stress time increases. A specific effective stress time will therefore establish a specific threshold voltage. Thus, as the chip continues to be used its effective stress time will increase from which the second stage 114 will provide new, higher threshold values. The operating set point circuit 115 will use the new, higher threshold values to apply higher voltages internal to the chip so it can maintain its specified speed.

Before the second stage 114 can refer to the reference relationship 201, however, the first stage 113 determines the effective stress time from relationship 202. The effective stress time is essentially the actual stress time (how long the transistors have been operating) as accelerated by the environmental conditions they are subjected to. That is, as observed in relationship 202, the actual stress time can effectively "accelerate" beyond the actual elapsed time as a function of supply voltage and temperature. In an embodiment, the effective stress time is determined as the actual stress time multiplied by an acceleration factor. The acceleration factor is determined from an exponential relationship that incorporates supply voltage and temperature as input parameters.

Although the above discussion has been directed to threshold voltages, another pair of relationships can also be implemented by stages 113, 114 to determine the change in transistor gain as well. For simplicity these are not shown in FIG. 2. Again, both relationships may be based on empirical evidence, theoretical derivations or some combination of the two.

Both stages 113, 114 of the aging determination circuitry 112 can be implemented as dedicated logic circuitry designed to effect the equations that establish their respective relationships, or, a controller, processing core or other circuit designed to execute program code (e.g., software or firmware) that is written to effect these equations, or, some combination of these two approaches. To the extent some form of program code is utilized, the code may be executed by any of a specialized controller dedicated to the purpose of specialized reliability and/or power management functions, a general purpose core of a multi-core processor, or, some other type of controller/processor that executes program code. The program code may be stored internally on the chip (e.g., in embedded non volatile circuitry) or may be loaded into the chip from an external source (e.g., a system firmware non volatile circuit).

As alluded to above, the aging of the transistors or some indication thereof as determined by the aging determination circuitry 112 (e.g., higher threshold voltage and lower gain), is provided to the operating set point circuitry 115. The operating set point circuitry 115 determines the proper supply voltage(s) to be applied to the semiconductor chip's transistors in view of their degradation. If the semi-conductor chip is early in its lifetime, the degradation effects are likely to be minimal. As such the operating set point circuitry 115 will maintain the application of lower voltages. As the semi-conductor chip extends toward later in life and more appreciable degradation effects are in play, the operating set point circuitry 115 will cause the voltages applied to the semiconductor chip's transistors to be raised.

Here, the set point circuitry 115 may be coupled to a power management controller, a DC-to-DC converter or other block of functionality within the semiconductor chip 100 that is responsible for actually setting specific voltages and/or maximum frequencies within the semiconductor chip 100. The voltages that may be set may include a general supply voltage that affects drain/source voltage (and typically applied gate voltage as well), internal and/or substrate "bias" voltages that are designed to, at least, affect threshold voltages, etc.

It has been found that the degradation effects of a transistor can actually be reversed in the course of a transistor's operational lifetime. Here, the degradation effects described above are a consequence of charges being trapped in certain regions of the transistor (at least for certain kinds of transistors). The accumulation of the charges in these regions has the effect of changing the threshold voltage and/or the gain of the transistor. The accumulated charge can be viewed as an undesired state of the transistor that forms as a consequence of the temperatures and voltages that are applied to the transistor during its operation. If the applied voltages are reduced, eliminated or reversed and an elevated temperature is applied to the transistor, the unwanted accumulated charges can be partially or wholly removed through a diffusion process that can be accelerated by temperature and/or electric field. The removal of the unwanted charge, in turn, partially or wholly returns the transistor to or toward its original manufactured state (with lower threshold voltage and higher gain).

With lower threshold and higher gain, going forward, the set point circuitry can reduce the supply and/or bias voltages that were applied to the transistors just prior to the degradation reversal process thereby reducing the power consumption of the device while, conceivably, maintaining the higher specified speed.

Figure 3:
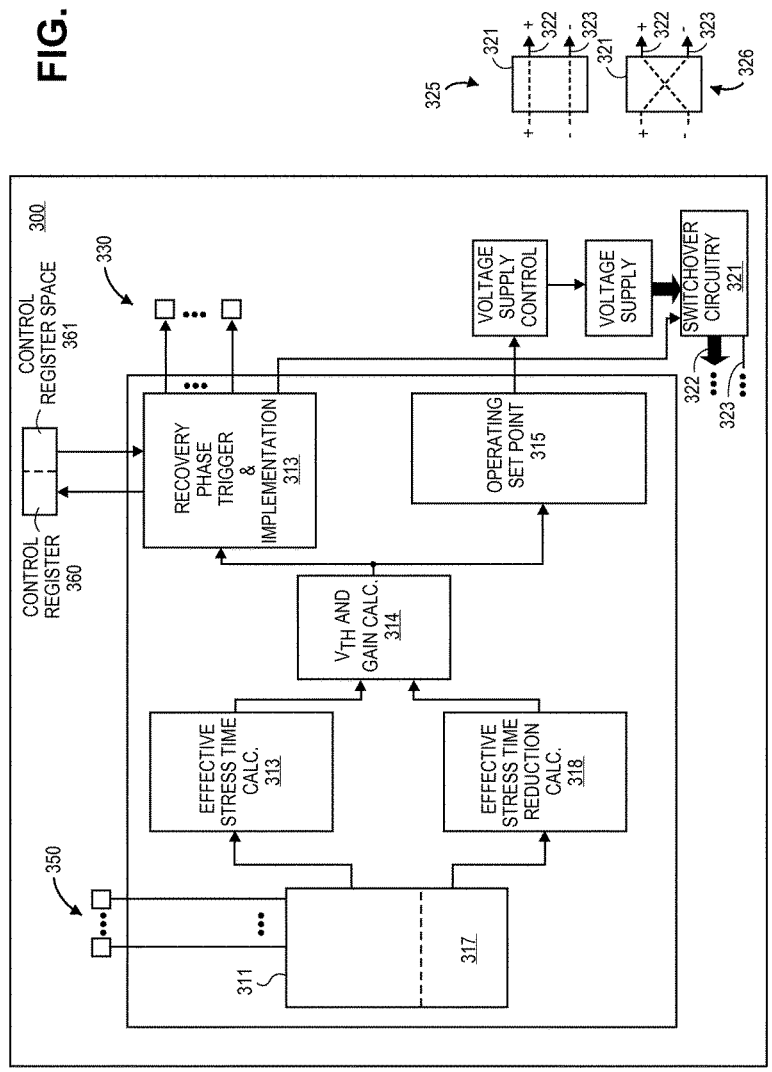
FIG. 3 shows an improved technology that reverses transistor degradation and accounts for the reversal in transistor degradation.

FIG. 3 shows an improved semiconductor chip 300 that not only includes transistor degradation compensation functionality but also includes circuitry designed to apply elevated temperatures to the semiconductor chip's transistors in order to reverse their degradation.

As observed in FIG. 3, the improved semiconductor chip 300 includes: 1) circuitry to trigger application of elevated temperatures (and in some embodiments even reversed voltages) 316; 2) circuitry that monitors transistor environment during the application of the elevated temperature during recovery 317; 3) circuitry that calculates the extent to which the degradation is reversed by way of the applied elevated temperature 318 (effective stress time reduction); 4) circuitry that calculates the effective aging of the transistors by considering both the effective stress time the transistors have endured during normal operation and the lessening of that effective stress time by any degradation reversal procedures that have been applied 314; 5) circuitry that monitors the environmental conditions applied to the transistors during their normal operation 311; 6) circuitry that determines the effective stress time during their normal operation 313; and, 7) circuitry 315 that determines the operating set point of the transistors based on their present threshold voltage and gain values.

By applying an elevated temperature during a degradation reversal or "recovery" phase and calculating the extent to which degradation has been reversed, the semiconductor chip 300 is able to determine new lower threshold voltages and/or new higher gains that permit lower supply voltages to be applied to the transistors while maintaining their speed of operation. These lower supply voltages are then actually applied by the operating set point circuit 315 so as to reduce power consumption going forward for a given speed as compared to what would have otherwise been consumed had the degradation effects not been reduced.

In an embodiment, circuitry 311 and circuitry 313 are the same/similar to circuitry 111 of FIG. 1 (that monitors transistor environment during their operation) and the first stage 113 of circuitry 112 of FIG. 1 (that determines the effective stress time resulting from their operation). Further, circuitry 314 may be the same or similar to the second stage 114 of circuitry 111 of FIG. 1 that provides new threshold and gain values based on effective stress time. However, unlike circuit 114, circuit 314 accepts effective stress time reduction (or reduced effective stress time) as an input value. Operating set point circuit 315 may also be the same/similar to circuit 115 of FIG. 1 in that it determines the internal operating voltage(s) based on new threshold and gain values. However, again, these values may now decrease owing to the degradation recovery phase.

As described in more detail below, "new" circuits 316, 317 and 318 are used to implement the degradation recovery phase and then quantify its effects so that the operating set point circuitry 315 can implement new, lower internal voltages within the semiconductor chip.

In an embodiment, the circuitry 316 that is designed to trigger the degradation phase steadily receives, over the course of normal operation, rising threshold voltage and/or lowering gain values from circuitry 314 owing to the degradation of the transistors. Eventually these values will reach respective thresholds one or both of which will warrant initiation of a recovery phase. As such, circuitry 316 triggers degradation reversal by, in an embodiment, performing the following: 1) reporting to software/firmware (e.g., through first control register space 360) that degradation reversal should be started; 2) waiting until software/firmware (e.g., through second control register space 361) informs circuitry 316 that the recovery phase may commence; 3) turning one or more heating elements 330 "on" in response to the command from software/firmware.

Between 1) and 2) above, software/firmware (and/or hardware) may dramatically slow down operation of the chip or cease its operation completely. For instance clock frequencies that are applied to the semiconductor chip may be dramatically reduced or even stopped so that the semiconductor chip 300 performs work at a significantly reduced pace or performs no work at all. In the later case (no work is performed by the chip), the chip's internal state information may be saved to (e.g., external) memory or other storage so that, after the degradation reversal process is complete, it can be later recalled to place the chip into the state it existed in just prior to the triggering of the degradation reversal process.

The heating element(s) 330 may be implemented as any heat generation device that is embedded within the chip, its package, outside its package or any of these in combination. For example, thermo-resistors may be embedded within the chip 300 at various locations of the chip's surface area. The thermo-resistors are provided with sufficient current during the recovery phase to generate the elevated temperatures.

In one embodiment, described in more detail below, after being informed the recovery phase can start, circuitry 316 will not only trigger the application of elevated temperatures but will also trigger the application of reversed electric fields through the transistors which will have the effect of removing the unwanted charge in a more efficient manner than elevated temperature alone.

The circuitry 317 that monitors transistor environment during the application of the elevated temperatures during recovery phase can be viewed as an extension or improvement to the environmental detection circuitry 111 discussed in FIG. 1. As such FIG. 3 depicts environmental detection circuitry 311 having this extension/improvement 317. Here, circuitry 317 includes circuitry designed to measure any of temperature, voltages, currents and time periods during which elevated temperatures are applied. Notably, in one embodiment, the same probes 350 (or at least some of them) are used during recovery phase monitoring as are used during normal operation monitoring.

In an embodiment, circuitry 318 determines the extent to which the effective stress time is reduced by way of the applied elevated temperature during the recovery phase. By determining the amount that the effective stress time has been reduced, a new smaller effective stress time is then applied to the reference relationship 201 embodied in circuit 314. Here, in an embodiment, circuit 314 contains the same reference relationship as relationship 201 in FIG. 2. Application of a lessened effective stress time to the relationship 201 produces a corresponding drop in threshold voltage, which, in turn, will cause the operating set point circuitry 312 to configure lower operating supply voltages going forward results in lower power consumption of the chip.

Figure 4:
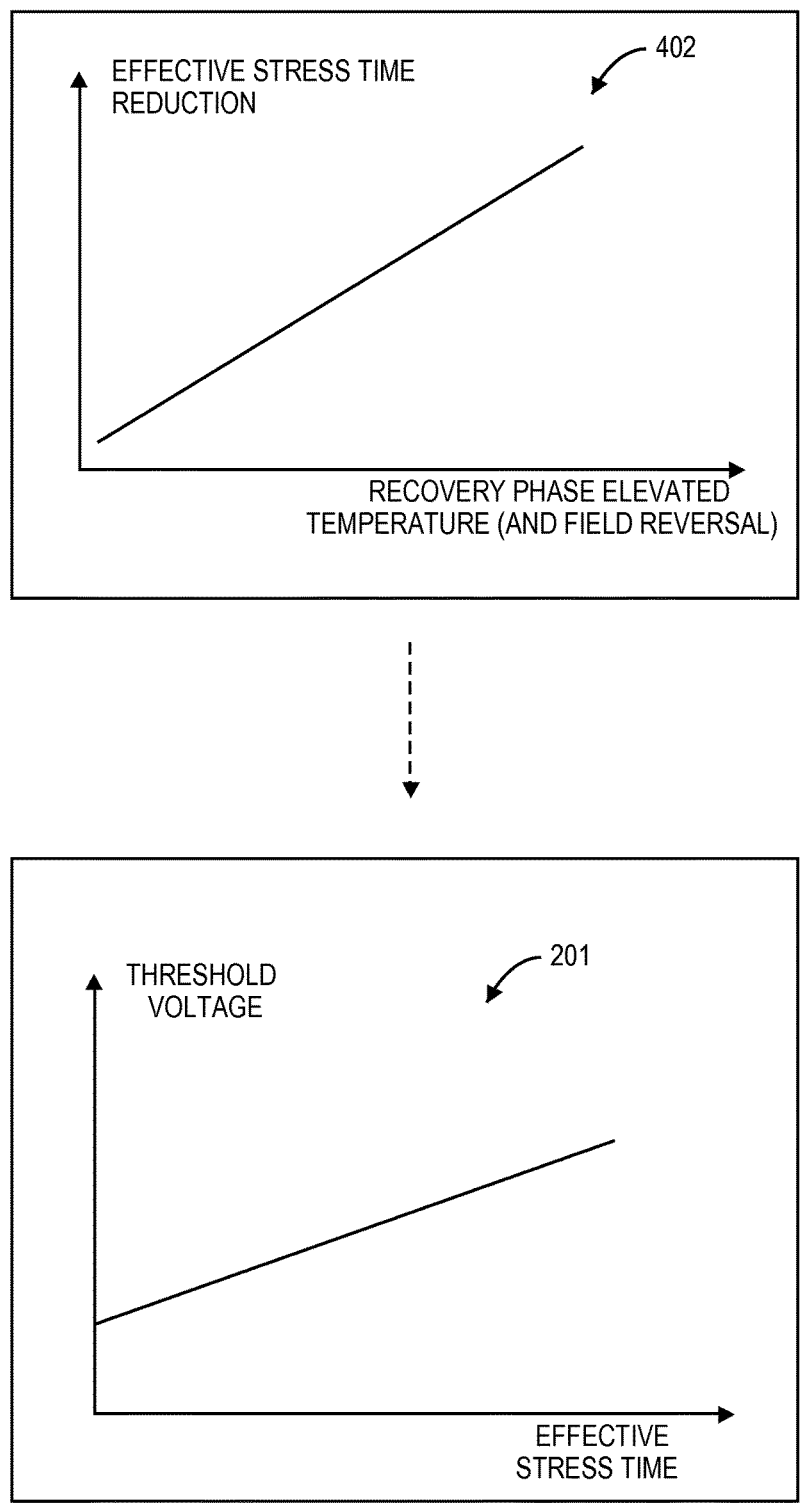
FIG. 4 shows relationships employed in an embodiment of the improved technology of FIG. 3.

FIG. 4 shows an embodiment of the approach that is directly comparable with the approach of FIG. 2. As observed in FIG. 4, relationship 201 of FIG. 2 is embedded in circuitry 314 and is still utilized as the reference relationship 201 that provides transistor threshold voltage as a function of effective stress time.

Relationship 402 of FIG. 4, however, is embedded in circuit 318 and provides the reduction in effective stress time as a function of the elevated temperatures that are applied during the recovery phase. In a sense, relationship 402 indicates the amount of unnatural accumulated charge in the devices that has been removed by way of the applied elevated temperature during the recovery. Relationship 402 can be determined empirically and/or derived from theoretical principles (e.g., based on the underlying transistor manufacturing technology). In an embodiment, relationship 402 is implemented as a "deceleration" factor of the effective stress time having exponential terms that are a function of the elevated temperature applied during the recovery.

Thus, whereas relationship 202 of FIG. 2 indicates the extent to which the actual elapsed time is accelerated to an effective stress time by way of the applied voltages and temperatures, by contrast, relationship 402 indicates the extent to which the effective stress time is de-accelerated to a lesser effective stress time by way of the elevated temperatures applied during the recovery phase.

With the change in effective stress time being determined by circuit 318 (in reference to relationship 402), a new, lower effective stress time will be applied to relationship 201 by circuit 314. In response, circuit 314 will provide the new, lower transistor threshold voltage that has resulted from the recovery phase. Operating set point circuitry 315 then sets the correct, lower supply voltages for the new, lower threshold voltage.

The lessening of the effective stress time as determined by circuit 318 can also be determined for transistor gain. Likewise, circuit 314 can embed another reference relationship for transistor gain. Thus, the set point operating circuitry 315 can establish a new, lower supply voltage based on both reduced threshold voltage and increased gain in response to an elevated temperature recovery phase.

The degradation reversal circuitry 318 can be implemented as dedicated logic circuitry designed to instantiate the effective transistor threshold voltage and transistor gain stress time reduction equations, or, a controller, processing core or other circuit designed to execute program code (e.g., software or firmware) that is written to effect these equations, or, some combination between these two approaches. To the extent some form of program code is utilized, the code may be executed by any of a specialized controller dedicated to the purpose of specialized reliability and/or power management functions, a general purpose core of a multi-core processor, or, some other type of controller/processor that executes program code. Here, any of circuits 313, 314, 315, 316 and 318 may be partially or wholly implemented with the same circuit that executes some form of program code (but different units of program code are utilized to perform the different functions).

Accordingly, the semiconductor chip may repeatedly reverse degradation a number of times over the course of its operational lifetime (e.g., each time effective aging reaches a threshold that triggers circuitry 316 to start a next degradation reversal phase). Thus, for instance, the semiconductor chip 300 may operate and the degradation of its transistors may be monitored. During this time internal voltages within the chip may be gradually raised by set point circuitry 315 to account for the degradation. Upon the degradation reaching a threshold after an extended period of time of operation, elevated temperatures are applied by circuit 316 to reverse the degradation. New improved threshold and gain values are determined in response to the degradation reversal which permits circuitry 315 to apply lower voltages than had just been applied. The semiconductor chip then continues to operate for another extended period of time before the degradation threshold is again reached and the degradation reversal process is again started. The process may be repeated any number of times over the course of the semiconductor chip's lifetime.

As alluded to above, in a further embodiment, the degradation reversal triggering circuitry 316 not only causes application of an elevated temperature during the degradation reversal phase but also causes a reverse oriented electric field to be applied within the semiconductor chip's transistors. Reversing the electric field within the semiconductor chip's transistors during application of an elevated temperature can enhance the efficiency at which the accumulated charge associated with degradation can be removed (at least for certain kinds of transistors).

FIG. 3 therefore shows degradation reversal triggering circuitry 316 coupled to switchover circuitry 321. In turn, switchover circuitry 321 is coupled between power supply rails 322, 323 and power supply 324 to reverse, during the degradation reversal phase, the direction of the electric fields that the transistors are nominally subjected to during normal operation.

Generally, the direction of electric field lines point from a node of higher voltage to a node of lower voltage. In the case of N type transistors, during normal operation, electric field direction is from a gate node to a source node and from a drain node to the source node pulling negative charged particles into the gate oxide area. By contrast in the case of P type transistors, during normal operation, electric field direction is from a source node to a gate node and from the source node to the drain node pulling positive charged particles.

During normal operation, to effect the field directions just mentioned above, the switchover circuitry 321 is configured by the degradation reversal triggering circuitry 316 as depicted at inset 325 to couple the "+" terminal of the power supply to the "+" supply rail 322, and, couple the "−" terminal of the power supply to the "−" supply rail 323. This configuration essentially corresponds to a degradation reversal "off" phase.

By contrast, during the degradation reversal phase, the switchover circuitry 321 is configured by the degradation reversal triggering circuitry 316 as depicted at inset 326 to couple the − terminal of the power supply to the + supply rail 322, and, couple the + terminal of the power supply to the − supply rail 323. This configuration essentially corresponds to a degradation reversal "on" phase. By switching the polarity of the voltage supply rails as compared to normal operation coupled with the application of an elevated temperature, the field directions within the transistors will be reversed and under higher temperature thereby removing with greater efficiency the charge associated with transistor degradation. In an embodiment, operation of the semiconductor chip is stopped if reverse oriented electric fields are applied during the degradation reversal phase.

Figure 5:
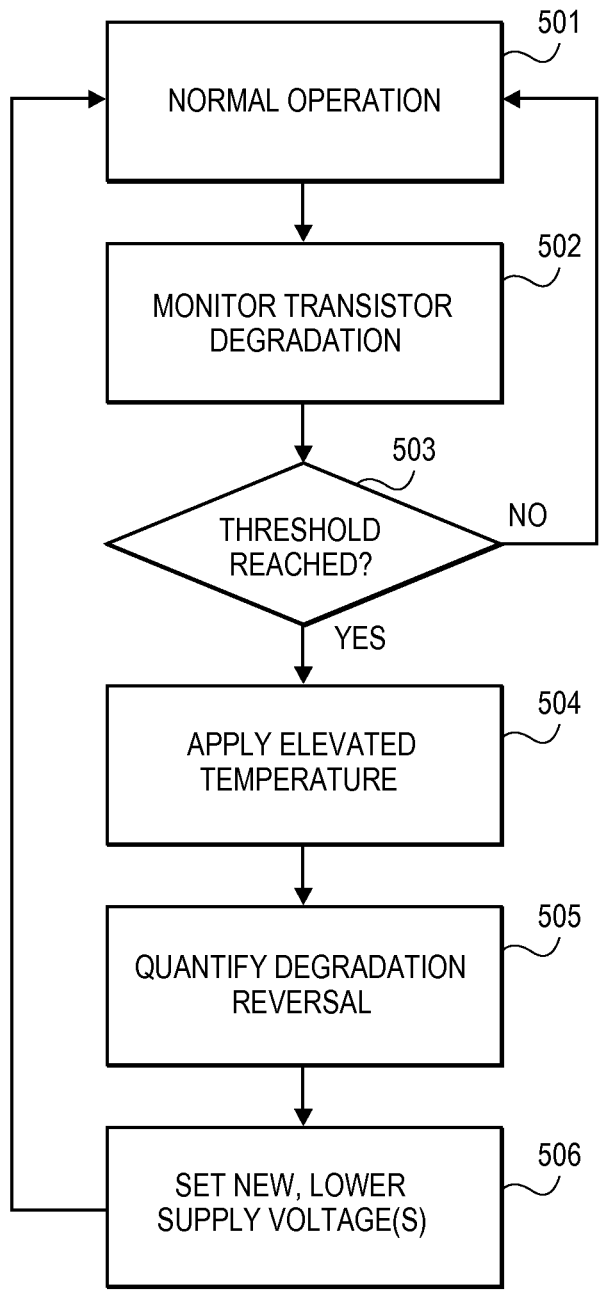
FIG. 5 shows a methodology performed by the improved technology of FIG. 3.

FIG. 5 shows a methodology performed by the semiconductor chip of FIG. 3. As observed in FIG. 5, a chip operates normally 501 while the degradation of its transistors are monitored 502. In response to the monitoring 502, the internal voltages of the chip are gradually raised to maintain operational speed yet account for the degradation. Eventually the degradation will reach a threshold 503 that triggers application of a degradation recovery phase during which, e.g., elevated temperatures are applied to reverse the degradation 504. In response to the elevated temperature, the degradation reversal is quantified 505 so that new, lower internal voltages can be applied within the chip 506. The chip then returns to normal operation.

Figure 6:
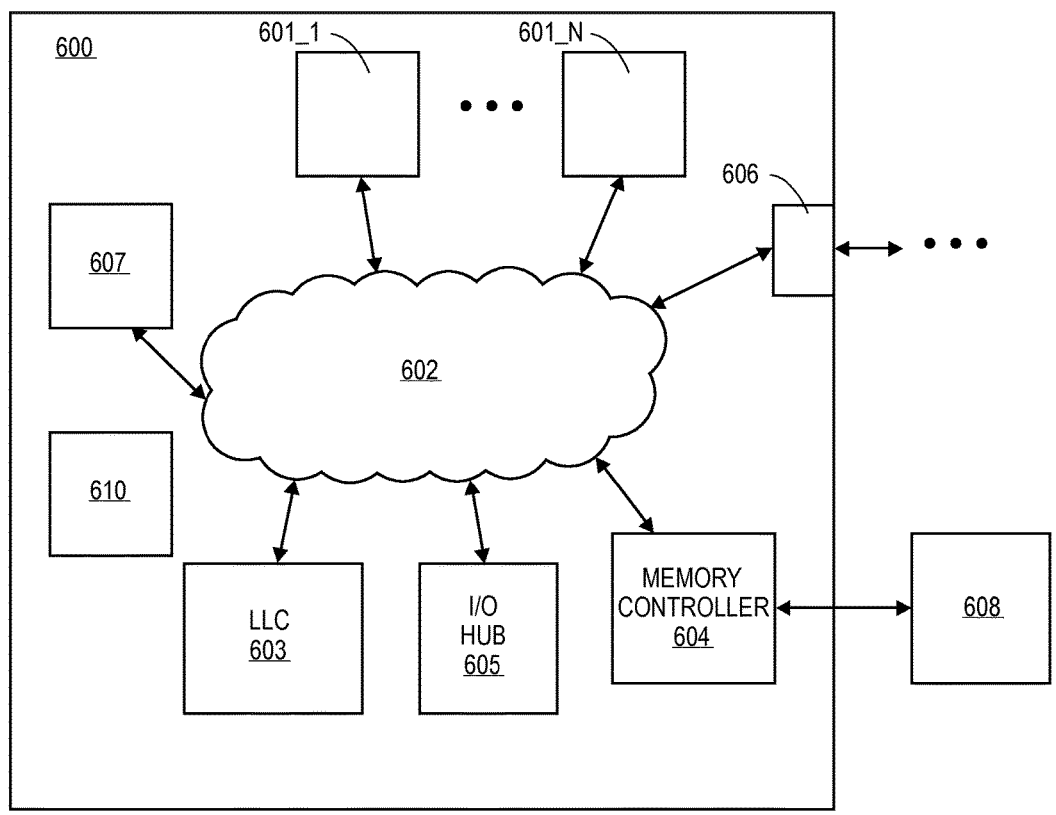
FIG. 6 shows a processor that can incorporate the improved technology of FIG. 3.

FIG. 6 shows the architecture of an exemplary multi-core processor 600. As observed in FIG. 6, the processor includes: 1) multiple general purpose processing cores 601_1 to 601_N; 2) an interconnection network 602; 3) a last level caching system 603; 4) a memory controller 604; 5) I/O hub 605; 6) a graphics processing unit 607; and, 7) power management circuitry 610. The power management circuitry 610 may include partially or wholly any/all of the circuits/functions discussed above with respect to FIG. 3. Any of the functions discussed above with respect to FIG. 3 may be partially/wholly performed by one or more of the processing cores 601_1 to 601_N of FIG. 6 (e.g., by power management software or firmware).

The stress and recovery control can reside within the power management unit 610 and can collect sensor data for each component of the processor separately and apply the recovery process to each block separately. As an example it will be possible to recover one core while the other core is still operational, this will allow accelerated recovery with reversed voltage bias applied which will put the core under recovery in a non-operational mode, but still keep the processor active.

The last level caching system 603 serves as a last layer of cache in the processor 600 before instructions and/or data are evicted to system memory 606. The memory controller 604 reads/writes data and instructions from/to system memory 606. The I/O hub 605 manages communication between the processor and "I/O" devices (e.g., non volatile storage devices and/or network interfaces). Port 608 stems from the interconnection network 602 to link multiple processors so that systems having more than N cores can be realized. Graphics processor 607 performs graphics computations. Other functional blocks of significance (phase locked loop (PLL) circuitry,) are not depicted in FIG. 6 for convenience.

Each of the processing cores 601_1 through 601_N is observed to include its own prefetcher circuit 610_1 through 610_N. Each prefetcher 610_1 through 610_N is coupled to its core's translation look-aside buffer (not shown) to receive page size information. The prefetcher circuits prefetch instructions and/or data for the streams of their respective cores. In a nominal implementation, the prefetchers 610_1 through 610_N issue prefetch requests to the last level cache 603 (at least if initial lookups in cache(s) local to their respective processors result in a miss). Misses in the last level cache 603 produce cause requests to be issued to system memory. If the processor 600 is just one processor in a multi-processor computer system, each processor is given may be given its own slice of system memory address space. As such, a request issued to system memory may traverse a network to be directed toward a processor that has been allocated the address of the request.

The cores 601_1 through 601_N may be homogenous or heterogeneous in terms of architecture instruction set; that is, two or more of the cores 601_1 through 601_N may be capable of execution the same instruction set, while others may be capable of executing only a subset of that instruction set or a different instruction set. In one embodiment, the cores 601_1 through 601_N are heterogeneous and include both the "small" cores and "big" cores described below.

Figure 7:
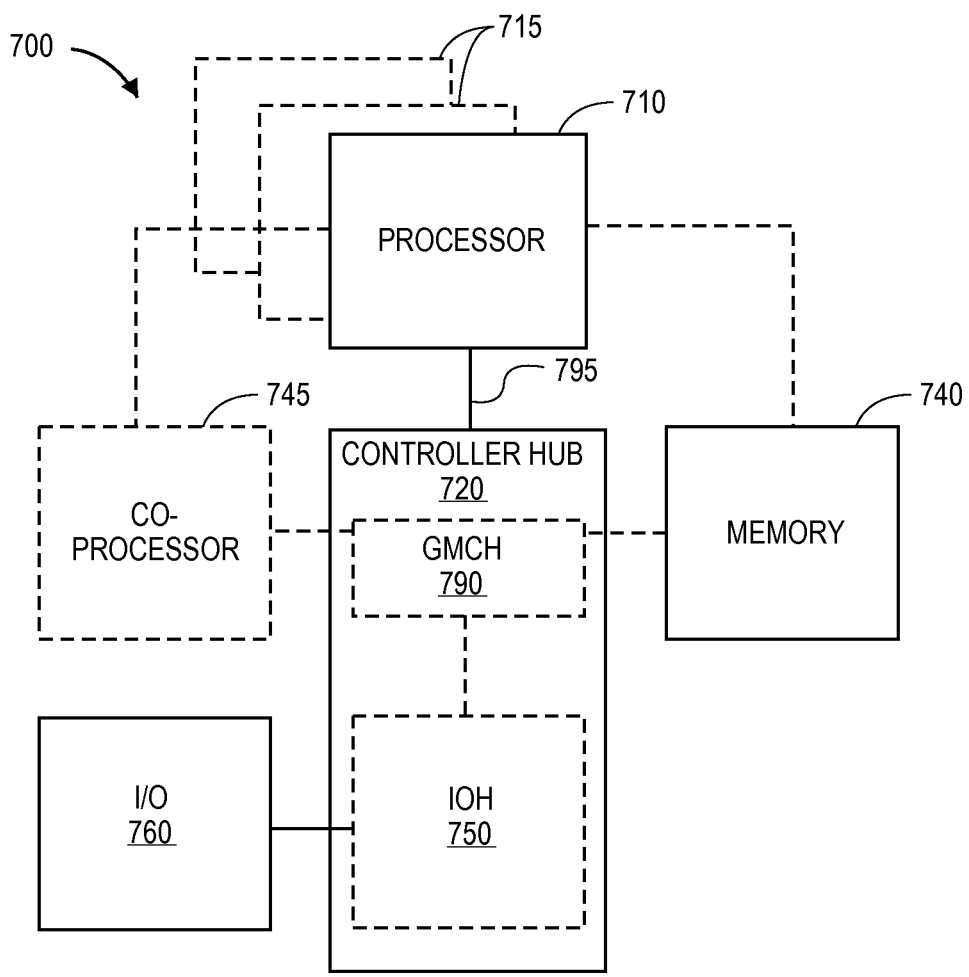
FIG. 7 illustrates a block diagram of a system in accordance with one embodiment of the present invention.
Figure 8:
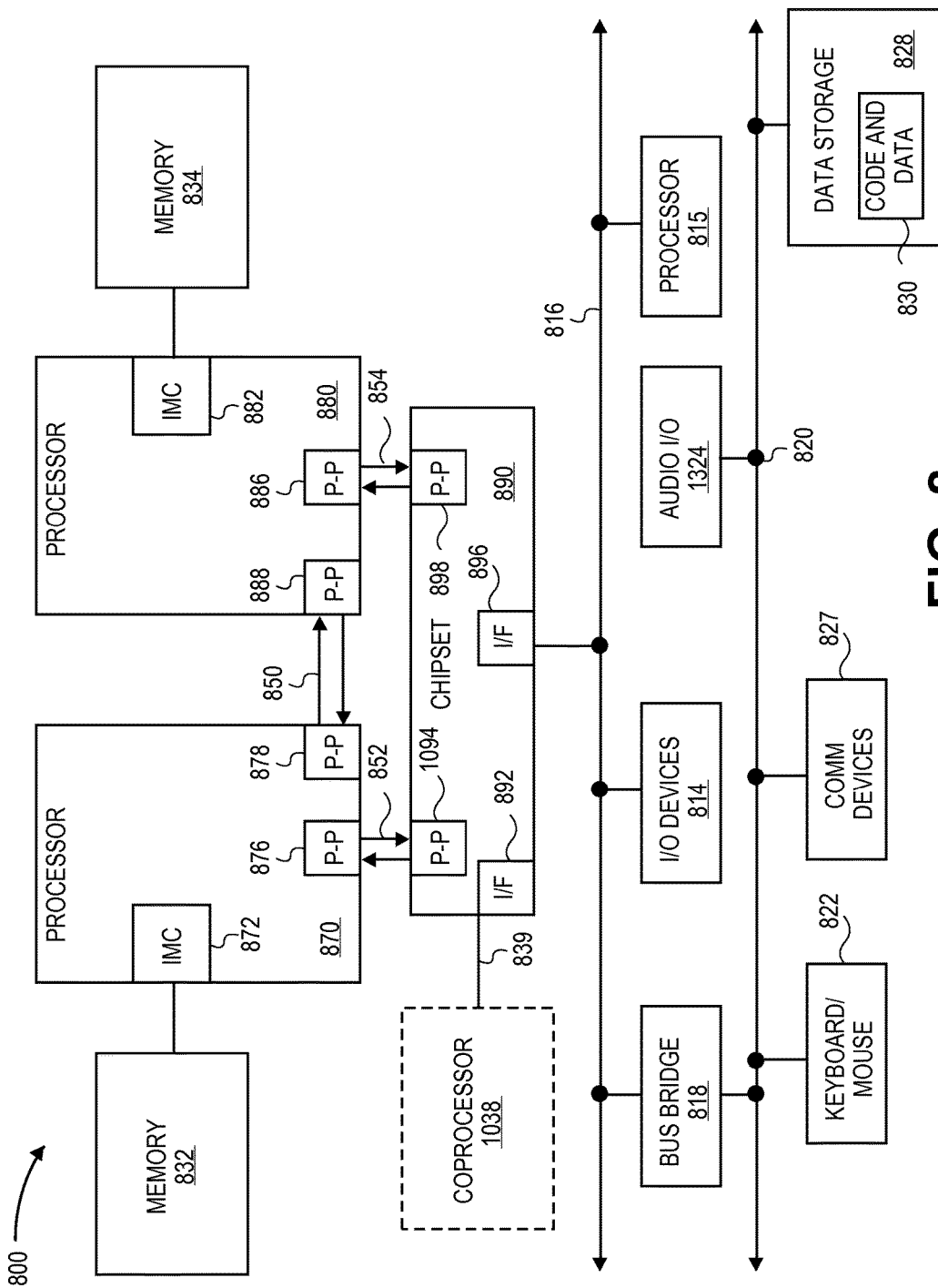
FIG. 8 illustrates a block diagram of a second system in accordance with an embodiment of the present invention.

FIGS. 7 and 8 show block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Referring now to FIG. 7, shown is a block diagram of a system 700 in accordance with one embodiment of the present invention. The system 700 may include one or more processors 710, 715, which are coupled to a controller hub 720. In one embodiment the controller hub 720 includes a graphics memory controller hub (GMCH) 790 and an Input/Output Hub (IOH) 750 (which may be on separate chips); the GMCH 790 includes memory and graphics controllers to which are coupled memory 740 and a coprocessor 745; the IOH 750 is couples input/output (I/O) devices 760 to the GMCH 790. Alternatively, one or both of the memory and graphics controllers are integrated within the processor (as described herein), the memory 740 and the coprocessor 745 are coupled directly to the processor 710, and the controller hub 720 in a single chip with the IOH 750.

The optional nature of additional processors 715 is denoted in FIG. 7 with broken lines. Each processor 710, 715 may include one or more of the processing cores described herein and may be some version of the processor 200.

The memory 740 may be, for example, dynamic random access memory (DRAM), phase change memory (PCM), or a combination of the two. For at least one embodiment, the controller hub 720 communicates with the processor(s) 710, 715 via a multi-drop bus, such as a frontside bus (FSB), point-to-point interface such as QuickPath Interconnect (QPI), or similar connection 795.

In one embodiment, the coprocessor 745 is a special-purpose processor, such as, for example, a high-throughput MIC processor, a network or communication processor, compression engine, graphics processor, GPGPU, embedded processor, or the like. In one embodiment, controller hub 720 may include an integrated graphics accelerator.

There can be a variety of differences between the physical resources 710, 715 in terms of a spectrum of metrics of merit including architectural, microarchitectural, thermal, power consumption characteristics, and the like.

In one embodiment, the processor 710 executes instructions that control data processing operations of a general type. Embedded within the instructions may be coprocessor instructions. The processor 710 recognizes these coprocessor instructions as being of a type that should be executed by the attached coprocessor 745. Accordingly, the processor 710 issues these coprocessor instructions (or control signals representing coprocessor instructions) on a coprocessor bus or other interconnect, to coprocessor 745. Coprocessor(s) 745 accept and execute the received coprocessor instructions.

FIG. 8 shows a block diagram of a first more specific exemplary system 800 in accordance with an embodiment of the present invention. As shown in FIG. 8, multiprocessor system 800 is a point-to-point interconnect system, and includes a first processor 870 and a second processor 880 coupled via a point-to-point interconnect 850. Each of processors 870 and 880 may be some version of the processor 200. In one embodiment of the invention, processors 870 and 880 are respectively processors 710 and 715, while coprocessor 838 is coprocessor 745. In another embodiment, processors 870 and 880 are respectively processor 710 coprocessor 745.

Processors 870 and 880 are shown including integrated memory controller (IMC) units 872 and 882, respectively. Processor 870 also includes as part of its bus controller units point-to-point (P-P) interfaces 876 and 878; similarly, second processor 880 includes P-P interfaces 886 and 888. Processors 870, 880 may exchange information via a point-to-point (P-P) interface 850 using P-P interface circuits 878, 888. As shown in FIG. 8, IMCs 872 and 882 couple the processors to respective memories, namely a memory 832 and a memory 834, which may be portions of main memory locally attached to the respective processors.

Processors 870, 880 may each exchange information with a chipset 890 via individual P-P interfaces 852, 854 using point to point interface circuits 876, 894, 886, 898. Chipset 890 may optionally exchange information with the coprocessor 838 via a high-performance interface 839. In one embodiment, the coprocessor 838 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 890 may be coupled to a first bus 816 via an interface 896. In one embodiment, first bus 816 may be a Peripheral Component Interconnect (PCI) bus, or a bus such as a PCI Express bus or another third generation I/O interconnect bus, although the scope of the present invention is not so limited.

As shown in FIG. 8, various I/O devices 814 may be coupled to first bus 816, along with a bus bridge 818 which couples first bus 816 to a second bus 820. In one embodiment, one or more additional processor(s) 815, such as coprocessors, high-throughput MIC processors, GPGPU's, accelerators (such as, e.g., graphics accelerators or digital signal processing (DSP) units), field programmable gate arrays, or any other processor, are coupled to first bus 816. In one embodiment, second bus 820 may be a low pin count (LPC) bus. Various devices may be coupled to a second bus 820 including, for example, a keyboard and/or mouse 822, communication devices 827 and a storage unit 828 such as a disk drive or other mass storage device which may include instructions/code and data 830, in one embodiment. Further, an audio I/O 824 may be coupled to the second bus 820. Note that other architectures are possible. For example, instead of the point-to-point architecture of FIG. 8, a system may implement a multi-drop bus or other such architecture.

Figure 9:
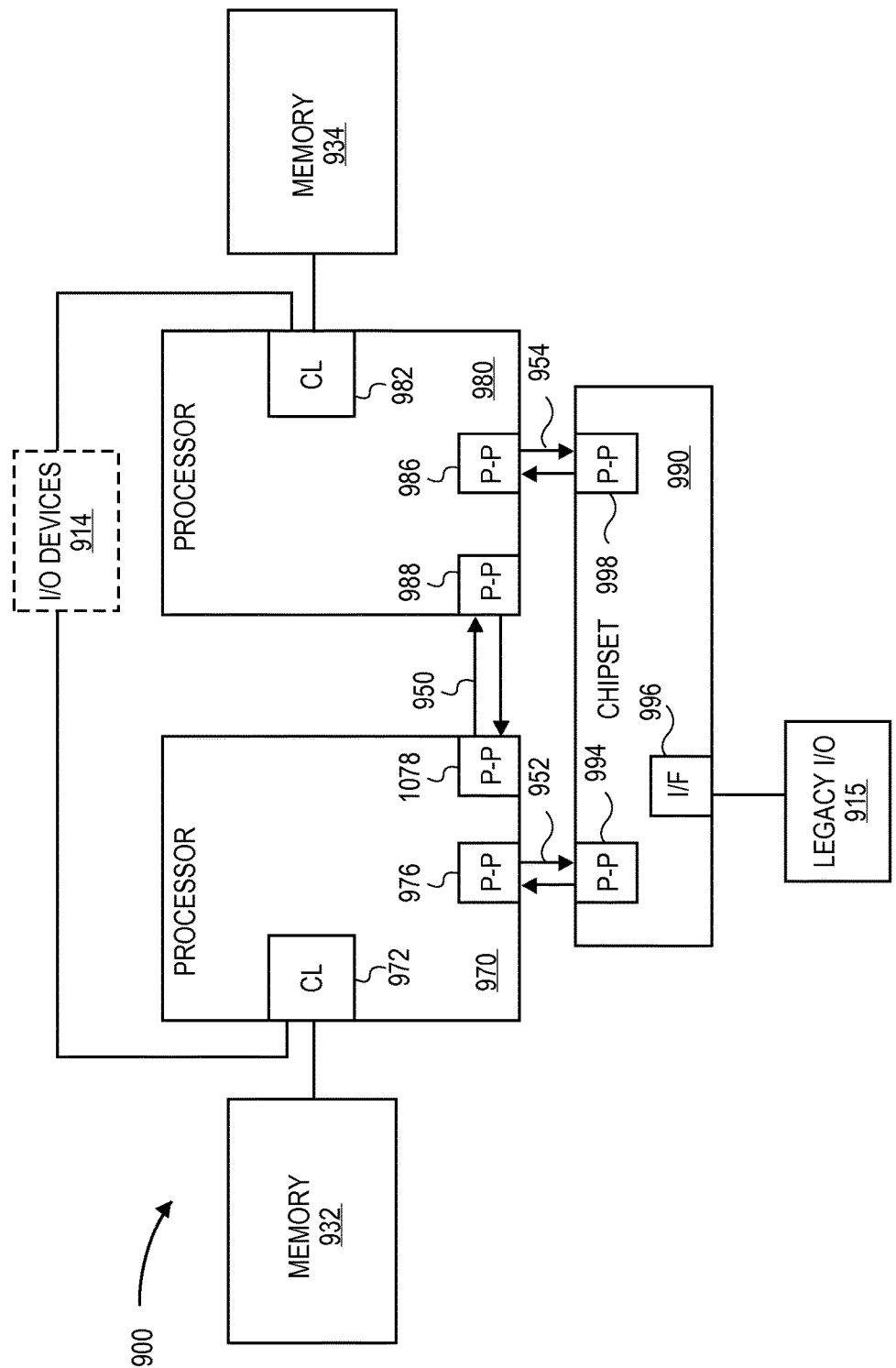
FIG. 9 illustrates a block diagram of a third system in accordance with an embodiment of the present invention.

FIG. 9 shows a block diagram of a second more specific exemplary system 900 in accordance with an embodiment of the present invention. Like elements in FIGS. 8 and 9 bear like reference numerals, and certain aspects of FIG. 8 have been omitted from FIG. 9 in order to avoid obscuring other aspects of FIG. 9.

FIG. 9 illustrates that the processors 870, 880 may include integrated memory and I/O control logic ("CL") 872 and 882, respectively. Thus, the CL 872, 882 include integrated memory controller units and include I/O control logic. FIG. 9 illustrates that not only are the memories 832, 834 coupled to the CL 872, 882, but also that I/O devices 914 are also coupled to the control logic 872, 882. Legacy I/O devices 915 are coupled to the chipset 890.

Figure 10:
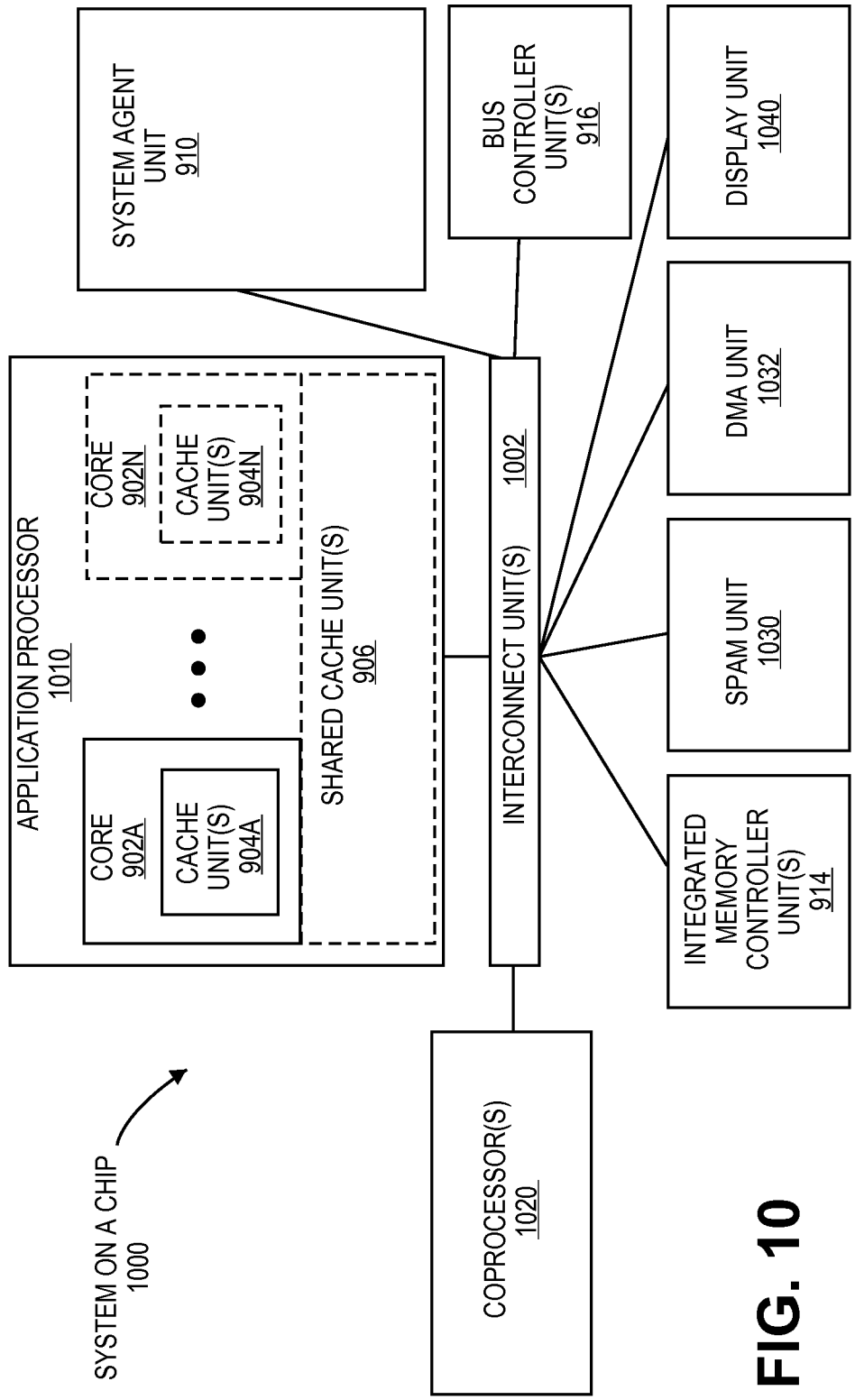
FIG. 10 illustrates a block diagram of a system on a chip (SoC) in accordance with an embodiment of the present invention.

Referring now to FIG. 10, shown is a block diagram of a SoC 1000 in accordance with an embodiment of the present invention. Dashed lined boxes are optional features on more advanced SoCs. In FIG. 10, an interconnect unit(s) 1002 is coupled to: an application processor 1010 which includes a set of one or more cores 1001_1 through 1001_N with respective internal cache units 1004_1 through 1004_N and shared cache unit(s) 1006; a system agent unit 1010; a bus controller unit(s) 1016; an integrated memory controller unit(s) 1014; a set or one or more coprocessors 1020 which may include integrated graphics logic, an image processor, an audio processor, and a video processor; an static random access memory (SRAM) unit 1030; a direct memory access (DMA) unit 1032; and a display unit 1040 for coupling to one or more external displays. In one embodiment, the coprocessor(s) 1020 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 830 illustrated in FIG. 8, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

FIG. 11 shows a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 11 shows a program in a high level language 1102 may be compiled using an x86 compiler 1104 to generate x86 binary code 1106 that may be natively executed by a processor with at least one x86 instruction set core 1116. The processor with at least one x86 instruction set core 1116 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1104 represents a compiler that is operable to generate x86 binary code 1106 (e.g., object code) that can, with or without additional linkage processing, be executed on the processor with at least one x86 instruction set core 1116. Similarly, FIG. 11 shows the program in the high level language 1102 may be compiled using an alternative instruction set compiler 1108 to generate alternative instruction set binary code 1110 that may be natively executed by a processor without at least one x86 instruction set core 1114 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1112 is used to convert the x86 binary code 1106 into code that may be natively executed by the processor without an x86 instruction set core 1114. This converted code is not likely to be the same as the alternative instruction set binary code 1110 because an instruction converter capable of this is difficult to make; however, the converted code will accomplish the general operation and be made up of instructions from the alternative instruction set. Thus, the instruction converter 1112 represents software, firmware, hardware, or a combination thereof that, through emulation, simulation or any other process, allows a processor or other electronic device that does not have an x86 instruction set processor or core to execute the x86 binary code 1106.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

From the foregoing a method has been described. The method includes monitoring degradation of a semiconductor chip's transistors during normal operation. The method further includes raising an internal voltage of the semiconductor chip in response to the degradation. The method further includes determining that the degradation has reached a threshold. The method further includes triggering application of an elevated temperature to the semiconductor chip so that the degradation is at least partially reversed. The method further includes applying a new lower internal voltage of the semiconductor chip in account of the degradation reversal.

From the foregoing a semiconductor chip has been described. The semiconductor chip includes first circuitry to determine degradation of a semiconductor chip's transistors during normal operation. The semiconductor chip includes second circuitry to determine that the degradation has reached a threshold. The semiconductor chip includes third circuitry to trigger application of an elevated temperature to the semiconductor chip so that the degradation is at least partially reversed. The semiconductor chip includes fourth circuitry to raise an internal voltage of the semiconductor chip in response to the degradation and to apply a new lower internal voltage of the semiconductor chip in account of the degradation reversal. The semiconductor chip includes fifth circuitry to apply a reversed voltage on the semiconductor chip in response to the degradation to accelerate the degradation reversal.

A processor having the above circuitry has also been described. A memory can be coupled to the processor.

What is claimed is:

1. A method comprising:
monitoring degradation of transistors of a semiconductor chip during normal operation;
raising an internal voltage of said semiconductor chip in response to said degradation;
determining that said degradation has reached a threshold;
triggering application of an elevated temperature to said semiconductor chip so that said degradation is at least partially reversed; and
applying a new lower internal voltage of said semiconductor chip in account of said degradation reversal.

2. The method of claim 1 wherein said method further comprises quantifying said degradation reversal by determining a new lower threshold voltage for the transistors of said semiconductor chip.

3. The method of claim 1 wherein said method further comprises quantifying said degradation reversal by determining a new higher gain for the transistors of said semiconductor chip.

4. The method of claim 1 further comprising monitoring said semiconductor chip's environment during said application of said elevated temperature.

5. The method of claim 1 further comprising determining a reduction in effective stress time in response to said application of said elevated temperature.

6. The method of claim 5 further comprising converting said reduced effective stress time to at least one of:
a lower transistor threshold voltage; and
a higher transistor gain.

7. The method of claim 1 wherein said semiconductor chip's maximum speed is maintained from said monitoring to said applying.

8. A semiconductor chip comprising:
first circuitry to determine degradation of transistors of a semiconductor chip during normal operation;
second circuitry to determine that said degradation has reached a threshold;
third circuitry to trigger application of an elevated temperature to said semiconductor chip so that said degradation is at least partially reversed;
fourth circuitry to raise an internal voltage of said semiconductor chip in response to said degradation and to apply a new lower internal voltage of said semiconductor chip in account of said degradation reversal; and fifth circuitry to apply a reversed voltage on said semiconductor chip in response to said degradation to accelerate said degradation reversal.

9. The semiconductor chip of claim 8 further comprising sixth circuitry to quantify said degradation reversal.

10. The semiconductor chip of claim 9 wherein said quantification of said degradation reversal at least includes one of:
lower transistor threshold voltage; and
higher transistor gain.

11. The semiconductor chip of claim 8 further comprising a heating element coupled to said third circuitry.

12. The semiconductor chip of claim 11 wherein said heating element is within said semiconductor chip.

13. The semiconductor chip of claim 12 wherein said heating element is within said semiconductor chip's package.

14. The semiconductor chip of claim 8 wherein said first, second, and third circuitry are implemented with a same circuit that executes program code stored on a non-transitory machine readable medium.

15. A computing system comprising:
a processor comprising:
first circuitry to determine degradation of transistors of said processor during normal operation,
second circuitry to determine that said degradation has reached a threshold,
third circuitry to trigger application of an elevated temperature to said processor so that said degradation is at least partially reversed, and
fourth circuitry to raise an internal voltage of said processor in response to said degradation and to apply a new lower internal voltage of said processor in account of said degradation reversal; and
a memory coupled to said processor.

16. The computing system of claim 15 wherein said first, second, and third circuitry are implemented with a same circuit that executes program code stored on a non-transitory machine readable medium.

17. The computing system of claim 15 further comprising a heating element coupled to said third circuitry.

18. The computing system of claim 17 wherein said heating element is within said processor.

19. The computing system of claim 17 wherein said heating element is within said processor's package.

20. The computing system of claim 17 wherein said heating element is external to said processor's package.

* * * * *